United States Patent [19]

Shu et al.

[11] Patent Number: 5,771,012
[45] Date of Patent: Jun. 23, 1998

[54] INTEGRATED CIRCUIT ANALOG-TO-DIGITAL CONVERTER AND ASSOCIATED CALIBRATION METHOD AND APPARATUS

[75] Inventors: Tzi-Hsiung Shu, Melbourne; Kantilal Bacrania, Palm Bay, both of Fla.

[73] Assignee: Harris Corporation, Palm Bay, Fla.

[21] Appl. No.: 712,027

[22] Filed: Sep. 11, 1996

[51] Int. Cl.$^6$ .................................................. H03M 1/06
[52] U.S. Cl. .......................................... 341/118; 341/120
[58] Field of Search .................................. 341/118, 122, 341/131, 155, 161, 120

[56] References Cited

U.S. PATENT DOCUMENTS 4,354,177  10/1982  Sloane ...................................... 340/347
4,894,656  1/1990   Hwang et al. ........................... 341/120

OTHER PUBLICATIONS

Yh–Min Lin et al., *IEEE Journal of Solid–State Circuits*, "A 13–b 2.5–MHz Self–Calibrated Pipelined A/D Converter in 3–μm CMOS", vol. 26, No. 4 (Apr. 1991), pp. 628–636.

Douglas A. Mercer, *IEEE Journal of Solid–State Circuits*, "A 14–b 2.5 MSPS Pipelined ADC with On–Chip EPROM", vol. 31, No. 3 (Jan. 1996), pp. 70–76.

*Primary Examiner*—Brian K. Young
*Attorney, Agent, or Firm*—Allen, Dyer, Doppelt, Milbrath & Gilchrist, P.A.

[57] ABSTRACT

An analog-to-digital converter (ADC) integrated circuit includes a subconverter stage having an amplifier with a non-ideal gain, and a reference voltage generator for generating a reference voltage for the subconverter stage. The reference voltage generator is adjustable and may include trimmable resistors for providing an adjusted or trimmed reference voltage to a second subconverter stage or second operation of the subconverter stage to compensate for a non-ideal gain of the amplifier. Complicated and difficult capacitor trimming for the amplifier is not needed; rather, a relatively simple and predictable trimming of thin film resistors in the reference voltage generator may be used to compensate for the non-ideal gain of the amplifier and improve performance. A method and apparatus for calibrating the ADC are also disclosed.

68 Claims, 7 Drawing Sheets

INTEGRATED CIRCUIT ANALOG-TO-DIGITAL CONVERTER AND ASSOCIATED CALIBRATION METHOD AND APPARATUS

FIELD OF THE INVENTION

The present invention relates to the field of electronics, and, more particularly, to an analog-to-digital converter and associated calibration method and apparatus.

BACKGROUND OF THE INVENTION

Analog-to-digital converters are widely used to process electrical signals in many electronic applications. An integrated circuit analog-to-digital converter (ADC) typically accepts an analog input voltage signal and converts the signal into a digital form as the output. A modern digital communication system, such as for a cellular telephone base station, for example, may often require an ADC with a high resolution of greater than 12 bits, a bandwidth greater than 200 MHz, and low power consumption and low distortion for improved overall system performance.

A pipelined ADC includes a series of subconverter stages with each stage including a flash analog-to-digital converter, a digital-to-analog converter (DAC) and an interstage amplifier connecting the DAC to an adjacent stage. The last stage typically includes only a flash ADC. A multi-step ADC may include one or more similar subconverter stages which are sequentially reused in generating the digital output signal.

There are several potential error sources in the subconverter stages of an integrated circuit analog-to-digital converter. These errors include offset, noise, DAC and flash ADC errors, and errors in the interstage gain amplifier. The subconverter flash ADC error may be readily corrected, for example, by the use of digital error correction logic circuits. The kT/C thermal noise error source caused in a sampled-data system may be reduced by proper choice of the sampling capacitor size.

Two dominant error sources in a high resolution pipelined or multi-step ADC are the DAC and the interstage amplifier gain errors. To reduce these two errors, a conventional method has been to measure the components that contribute to the errors, and then calculate and implement the calibration. However, the effectiveness of the calibration is often judged by the linearity of the analog-to-digital converter. Although the correlation between the converter linearity and the error contributing components is theoretically close, it is still only an indirect method to achieve good linearity through component measurement/calibration.

U.S. Pat. No. 4,354,177 to Sloane discloses an apparatus and method for exciting the input of an ADC with exponential signals to generate histograms to determine an amplitude probability distribution of each digital output value. The histograms may be processed in a manner which produces the transfer characteristic of the converter under test which is independent of the dynamic characteristics of the excitation signals, thus eliminating the need for accurate knowledge of the parameter values of the testing circuit.

The DAC of an analog-to-digital converter typically includes a resistor ladder network formed by thin film resistors. These resistors may be laser trimmed to reduce the DAC error. However, the interstage gain error is not as readily determined and corrected. In the past, attempts have been made to trim the capacitors or disconnect small value trimming capacitors associated with a switched capacitor interstage amplifier as disclosed, for example, in an article entitled "A 13-b 2.5-MHz Self-Calibrated Pipelined A/D Converter in 3-$\mu$m CMOS" by Lin et al. appearing in IEEE Journal of Solid-State Circuits, vol. 26, No. 4, April 1991. Unfortunately, trimming capacitors may be extremely difficult in practice, especially to achieve predictable and accurate results. Predictable results are also very difficult when disconnecting small trim capacitors to calibrate the gain.

SUMMARY OF THE INVENTION

In view of the foregoing background, it is therefore an object of the present invention to provide an integrated circuit analog-to-digital converter being readily calibrated to have higher accuracy.

It is another object of the present invention to provide a method and apparatus for readily calibrating an analog-to-digital converter to have higher accuracy.

These and other objects, features and advantages of the present invention are provided by an analog-to-digital converter (ADC) integrated circuit which in one embodiment preferably comprises a plurality of subconverter stages with a first subconverter stage including an amplifier having a non-ideal gain, and reference voltage means for generating reference voltages for the subconverter stages, and wherein the reference voltage means preferably comprises adjusted reference voltage output means for providing an adjusted reference voltage to a second subconverter stage to compensate for the non-ideal gain of the amplifier. The ADC may also preferably include output means connected to the subconverter stages for generating a digital output signal.

The first subconverter stage may preferably comprise a switched capacitor amplifier for driving the second subconverter stage. Moreover, the reference voltage means may include original reference voltage output means for providing an original reference voltage to the first subconverter stage, and while the adjusted reference voltage output means provides the adjusted reference voltage to the second subconverter stage to compensate for the non-ideal gain of the switched capacitor amplifier. Accordingly, complicated and difficult capacitor trimming for the amplifier is not needed. Rather, a relatively simple and predictable trimming of thin film resistors, for example, in the reference voltage means may be used to compensate for the non-ideal gain of the amplifier.

The analog-to-digital converter (ADC) may have a non-ideal amplifier gain that results in either one or more missing codes or one or more overlapping codes in the digital output signal. Adjustment of the reference voltage, such as by trimming of the reference voltage resistors readily corrects for either type of error. Moreover, the amplifier gain of subsequent stages may also be adjusted to provide even greater accuracy.

The subconverter stages may each also preferably comprise a flash analog-to-digital converter (DAC), and a digital-to-analog converter connected to the flash analog-to-digital converter. Since error in the DAC is another significant concern, the DAC of the first stage also preferably includes a trimmed thin film resistor network to compensate for such an error.

The ADC also preferably includes output means connected to the subconverter stages for generating a digital output signal. The output means may comprise digital delay and digital error correction means for further correcting the output signal. The ADC may also include timing control means for supplying clock signals to the sampling means and the subconverter stages. In addition, the sampling means of the ADC may also be provided by open loop sampling means for operating at a relatively wide bandwidth.

Another embodiment of the analog-to-digital converter integrated circuit in accordance with the present invention comprises a subconverter stage and timing control means associated therewith for successively operating the subconverter stage a plurality of times. The subconverter stage also preferably comprises an amplifier, such as a switched capacitor amplifier, for driving a second and subsequent operations of the subconverter stage. The amplifier may also have a non-ideal gain that is corrected by reference voltage means for generating reference voltages for each operation of the subconverter stage. The reference voltage means may include adjusted reference voltage output means for providing an adjusted reference voltage for a second operation of the subconverter stage to compensate for the non-ideal gain of the amplifier. Subsequent operations may also have their respective reference voltages adjusted.

A method aspect of the present invention is for enhancing the accuracy of an analog-to-digital converter integrated circuit including a plurality of subconverter stages as described above. More particularly, the method preferably includes the steps of: generating a first output histogram for the ADC; and adjusting the adjustable reference voltage output means, based upon the first output histogram, to provide an adjusted reference voltage to the second subconverter stage to compensate for the non-ideal gain of the amplifier and thereby provide enhanced accuracy for the ADC integrated circuit. The method may also preferably include the step of estimating an amount of adjusting based upon the first output histogram, and wherein the adjusting is carried out based on the estimated amount of needed adjusting.

The subconverter stages may also include a digital-to-analog converter including trimmable resistor network. Accordingly, the method preferably further comprises the step of trimming the resistor network to compensate for an error in the digital-to-analog converter of the first subconverter stage.

Another method aspect according to the invention is for enhancing the accuracy of an analog-to-digital converter integrated circuit of a type comprising a subconverter stage and timing control means for successively operating the subconverter stage a plurality of times. The method preferably includes the steps of: generating a first output histogram for the ADC; and adjusting the adjustable reference voltage output means, based upon the first output histogram, to provide an adjusted reference voltage for the second operation of the subconverter stage to compensate for the non-ideal gain of the amplifier and thereby provide enhanced accuracy for the ADC integrated circuit.

An apparatus in accordance with another aspect of the invention is for enhancing the accuracy of an ADC integrated circuit of a type comprising first and second subconverter stages as described above. The apparatus preferably includes: first histogram means for generating a first output histogram for the ADC; and first adjusting means for adjusting the adjustable reference voltage output means of the ADC, based upon the first output histogram, to provide an adjusted reference voltage to the second subconverter stage to compensate for the non-ideal gain of the amplifier of the first subconverter stage and thereby provide enhanced accuracy for the ADC integrated circuit. The apparatus preferably further comprises estimating means for estimating an amount of adjusting based upon the first output histogram prior to the adjusting. The adjustable reference voltage means may be provided by at least one thin film resistor; and wherein the first adjusting means comprises laser trimming means for trimming the thin film resistor.

The subconverter stages of the ADC may include a digital-to-analog converter including a trimmable resistor network. The apparatus may thus preferably further comprise DAC trimmer means for trimming the resistor network to compensate for an error in the digital-to-analog converter of the first subconverter stage.

Yet another aspect of the present invention is directed to an apparatus for enhancing the accuracy of an analog-to-digital converter integrated circuit of a type comprising a subconverter stage and timing control means for successively operating the subconverter stage a plurality of times. This embodiment of the apparatus preferably comprises: first histogram means for generating a first output histogram for the ADC; and first adjusting means for adjusting the adjustable reference voltage output means, based upon the first output histogram, to provide an adjusted reference voltage for the second operation of the subconverter stage to compensate for the non-ideal gain of the amplifier and thereby provide enhanced accuracy for the ADC integrated circuit.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
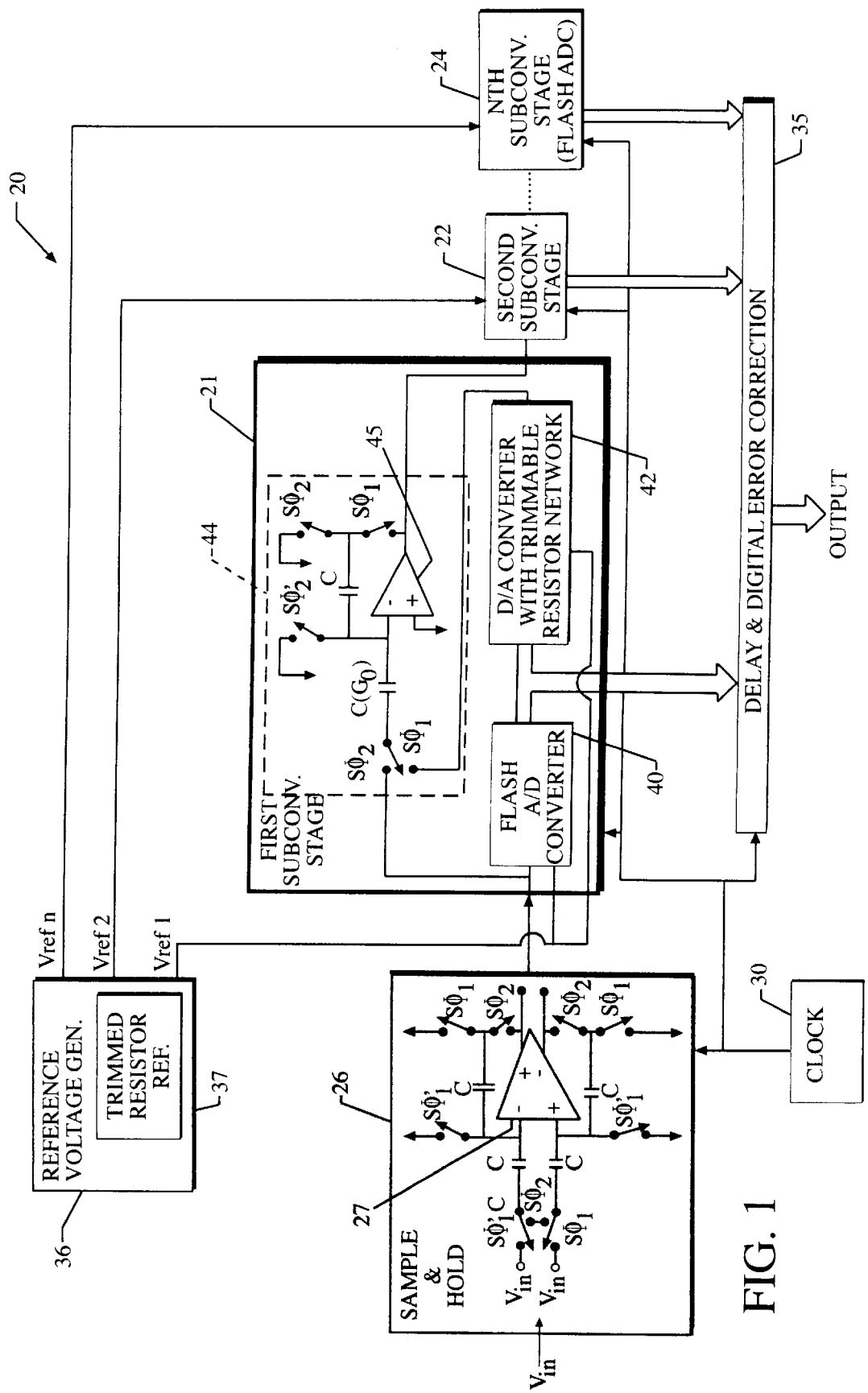
FIG. 1 is a schematic diagram of a first embodiment of an analog-to-digital converter in accordance with the present invention.

Referring now initially to FIG. 1, an embodiment of an analog-to-digital converter 20 in accordance with the invention is described. The illustrated ADC 20 includes a plurality of subconverter stages 21, 22 and 24 connected together in a pipelined configuration as would also be readily understood by those skilled in the art. The outputs of the subconverter stages 21, 22 and 24 are coupled to a delay and digital error correction circuit 35 as would be readily understood by those skilled in the art. The digital output of the illustrated ADC 20 is produced by the delay and digital error correction circuit 35. Other output means are also contemplated by the present invention for providing the digital output signal from the plurality of subconverter stages as would be readily understood by those skilled in the art.

The ADC 20 also includes the illustrated sample and hold circuit 26 for providing a relatively large input bandwidth. The sample and hold circuit 26 includes the illustrated amplifier 27 and the associated capacitors C and switches S driven by signals from the illustrated clock 30 as would be readily understood by those skilled in the art.

The illustrated reference voltage generator 36 provides reference voltages for each of the subconverter stages 21, 22 and 24. In particular, each of the subconverter stages 21, 22 and 24 may preferably include a flash analog-to-digital converter 40 as shown with reference to the detailed schematic portion of the first subconverter stage 21. As would be readily understood by those skilled in the art, the flash ADC 40 may preferably be provided by a string of thin film resistors producing inputs to a plurality of comparators driving associated logic decoding circuitry. A reference voltage Vref1 feeds the string of resistors for the flash ADC 40 as would also be understood by those skilled in the art.

The output of the flash ADC 40 is connected to a digital-to-analog converter 42 and is also connected to the illustrated delay and digital error correction circuit 35. The digital-to-analog converter is connected to a switched capacitor amplifier 44 as illustrated. The switched capacitor amplifier 44 serves as an interstage amplifier and drives the second subconverter stage 22. The switched capacitor amplifier 44 includes the illustrated amplifier 45, capacitors C and various switches S driven by clock signals. In particular, the capacitor $C(G_o)$ indicates that this capacitor is a factor in determining the original gain $G_o$ of the amplifier 44 as discussed in greater detail below.

The present invention addresses two dominant error sources in a high resolution pipelined or multi-step ADC. These errors are from the DAC 42 and the interstage gain amplifier 44. In the past, an attempt has been made to trim the capacitors or disconnect small value trimming capacitors associated with a switched capacitor amplifier to correct of non-ideal gain as disclosed, for example, in the article entitled "A 13-b 2.5-MHz Self-Calibrated Pipelined A/D Converter in 3-$\mu$m CMOS" by Lin et al. appearing in IEEE Journal of Solid-State Circuits, vol. 26, No. 4, April 1991. Unfortunately, trimming capacitors may be difficult in practice to achieve predictable and accurate results. Disconnecting small capacitors may also produce unpredictable changes.

Another conventional approach has been to measure the components that contribute to the errors, and then to calculate and implement the calibration. However, the effectiveness of the calibration is often judged by the linearity of the converter. Although the correlation between the converter linearity and the error contributing component is theoretically close, it is still an indirect method to achieve good linearity through component measurement/calibration.

One aspect of the present invention is a correction or calibration technique based on the measurement of the ADC histogram, which has a one-to-one correspondence to the ADC linearity. It bypasses the component measurement and achieves good ADC linearity through direct component calibration based on histogram measurements.

It has been shown that in an n-bit ADC with an m-bit first stage and a normalized reference voltage of 1V, the residual voltage output from the interstage gain amplifier, digitized by the remainder of the ADC with an rV reference, contains the two error terms $$E_{DAC}(V_i) = \frac{2^{n-m+1}}{r} G\Delta V_{DAC}(D_m(V_i)).$$

and $$E_{gain}(V_i) = 2^n \left( \frac{G}{G_0 r} - 1 \right) (V_i - V_{DACO}(D_m(V_i)))$$

As a first step, the two error sources may be separated and treated independently. With the DAC error corrected, the interstage gain error appears in the converter transfer curve with a constant discontinuity, J, between two adjacent code segments, where $$J = -2^{n-m} \left( \frac{G}{G_0 r} - 1 \right).$$

which results in missing codes (DNL=−1) or overlapped codes (DNL=1). The DNL can be returned to the normal value of 0 by reducing the last equation to 0, which implies that $G=G_0 r$ and where G is the actual gain and $G_o$ is the ideal gain. The calibration can therefore be done by monitoring the DNL changes. Conventional methods have been to trim/calibrate the gain $G=G_0$ by forcing r=1. However, it can also be achieved by calibrating $r=G/G_0$ in accordance with the present invention.

The above concept can be implemented in several different ways. For example, an ADC 20 may use a standard 4-stage (4 bits/stage) pipelined architecture as illustrated. The first subconverter stage 21 may include a resistor ladder DAC 42, a 4-bit flash ADC 40, and an interstage gain amplifier 44 with $G_0=8$. The DAC can be background-calibrated to achieve the required 12-b accuracy, for example, and as would be readily understood by those skilled in the art. However, since the fabrication process offers thin-film resistors, a conventional laser-trim method may preferably be used.

According to one important aspect of the present invention, instead of trimming/calibrating the capacitors of the switched capacitor amplifier 44 for an exact gain of 8, the reference voltages to the remaining stages are calibrated to match the gain by monitoring the histogram of the ADC 20 output. The changes to the reference voltages may be readily accomplished through laser-trimmed resistor ladders in the reference voltage generator 36. Those of skill in the art will readily appreciate that other techniques for adjusting the reference voltages are also contemplated by the present invention, such as including, for example, disconnecting fuse links, using a digital-to-analog converter, etc.

The illustrated ADC 20 further includes a reference voltage generator 36 for generating reference voltages Vref1, Vref2 and Vrefn for the subconverter stages. The reference voltage generator 36 illustratively includes a trimmed reference voltage output circuit 37 for providing a trimmed reference voltage Vref2 to a second subconverter stage 22 to compensate for a non-ideal gain of the amplifier. The trimmed reference voltage output circuit 37 may include a thin film resistor network being laser trimmed as would be readily understood by those skilled in the art. Accordingly, complicated and difficult capacitor trimming for the amplifier 44 is not needed. Rather, a relatively simple and predictable trimming of a thin film resistor network 37 in the reference voltage generator 36 may be used to compensate for the non-ideal gain of the amplifier. The other reference voltages Vref1 and Vrefn may be their original values since reference voltage trimming is typically only needed for the second stage. Alternatively, the reference voltages to a third and/or subsequent subconverter stages may also be similarly individually calibrated as would be readily understood by those skilled in the art. Yet another variation may provide the adjusted reference voltage for the second stage to the downstream stages.

Figure 2:
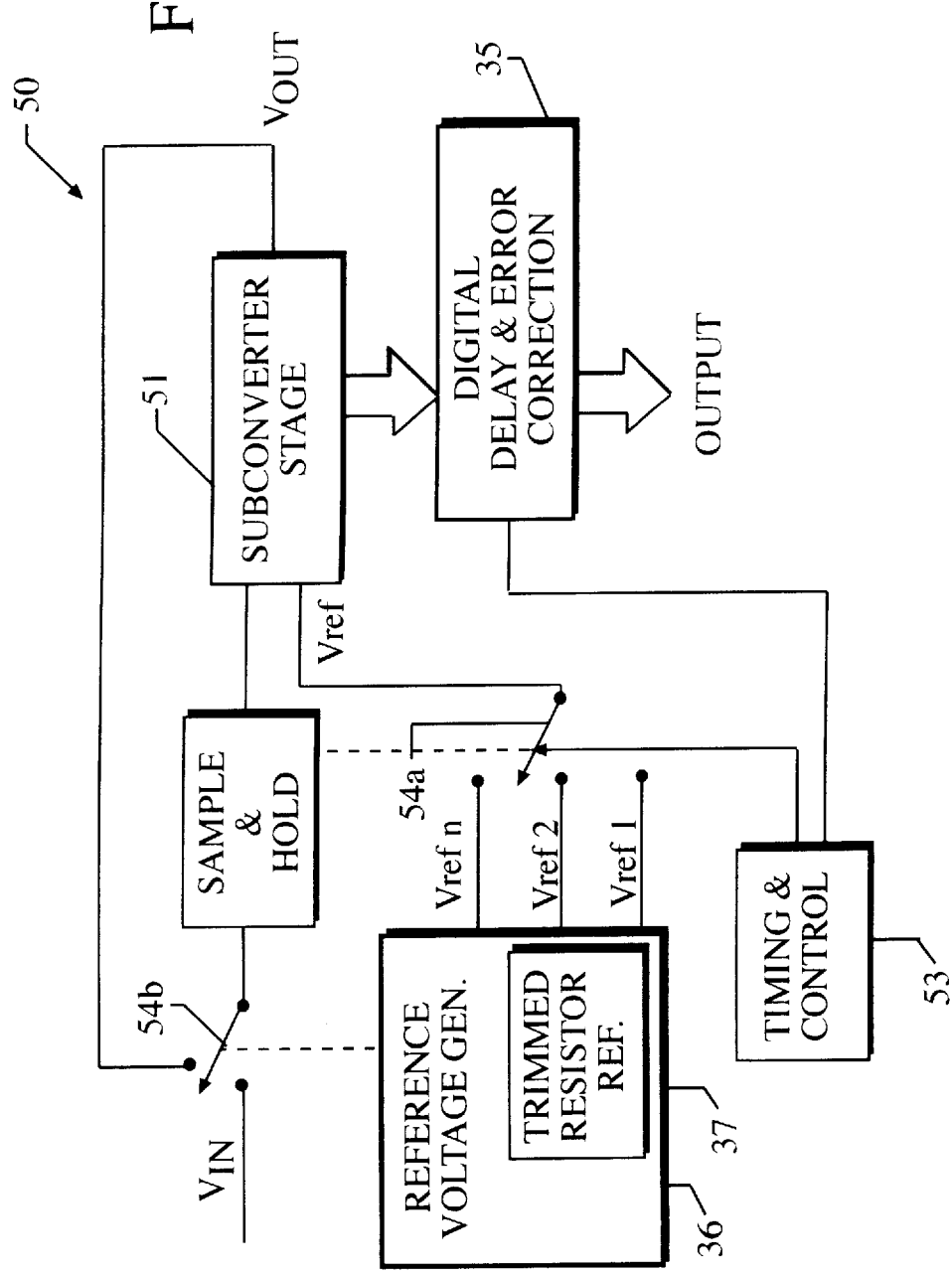
FIG. 2 is a schematic diagram of a second embodiment of an analog-to-digital converter in accordance with the present invention.

Turning now additionally to FIG. 2, another embodiment of a multi-step ADC 50 in accordance with the invention is described. In this embodiment, the subconverter stage 51 is repetitively used by operation of the timing and control circuit 53 and the associated switching means 54 as would be readily appreciated by those skilled in the art. The other elements are similar to those described above and need no further explanation herein. In this embodiment, the reference voltage provided for the second step of the conversion Vref2 is adjusted by the illustrated trimmed resistor reference 37 to account for the non-ideal amplifier gain. As noted above other equivalent circuits may also be used to adjust the reference voltages to correct for the non-ideal amplifier gain.

Figure 3:
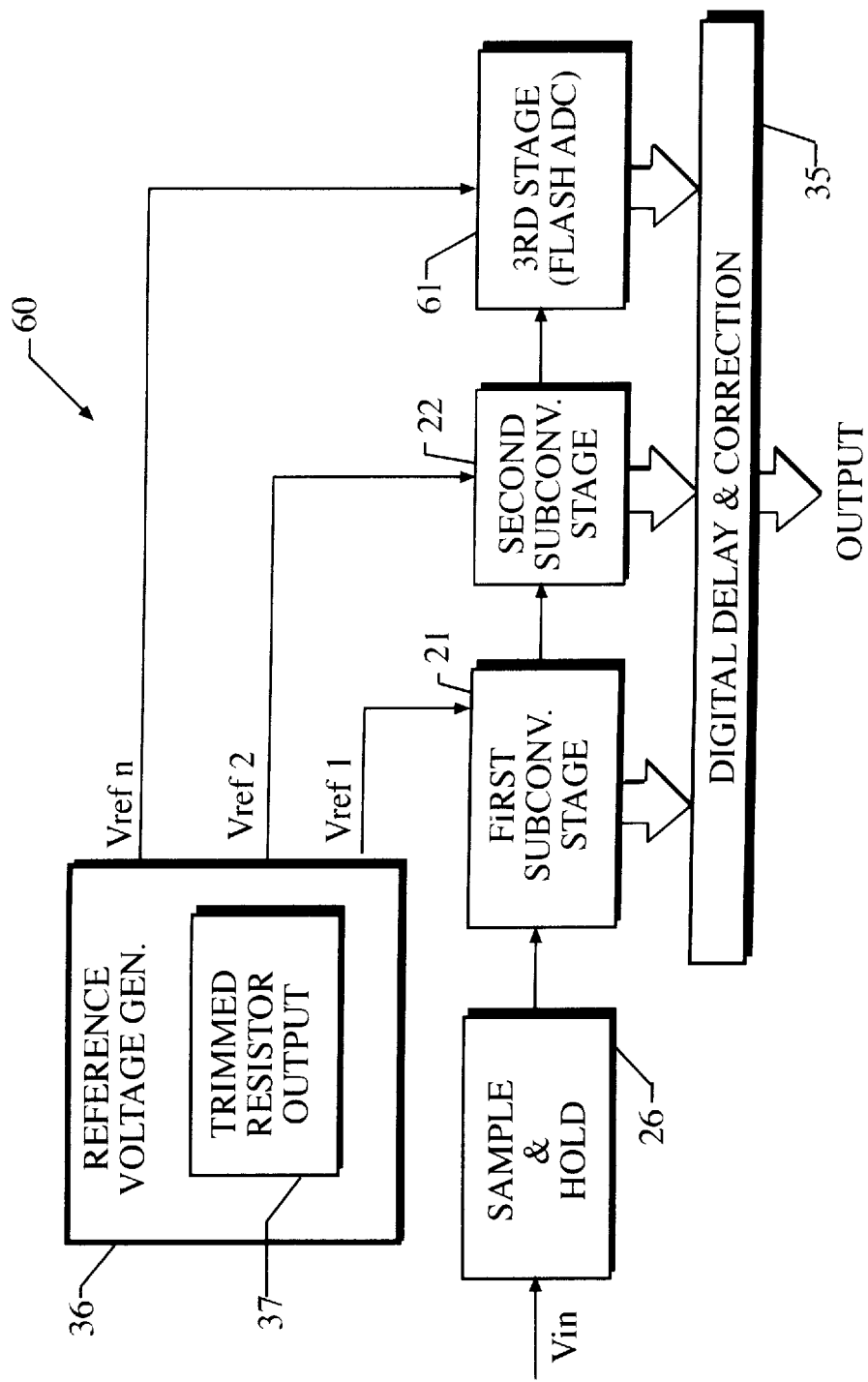
FIG. 3 is a schematic diagram of a third embodiment of an analog-to-digital converter in accordance with the present invention.
Figure 4:
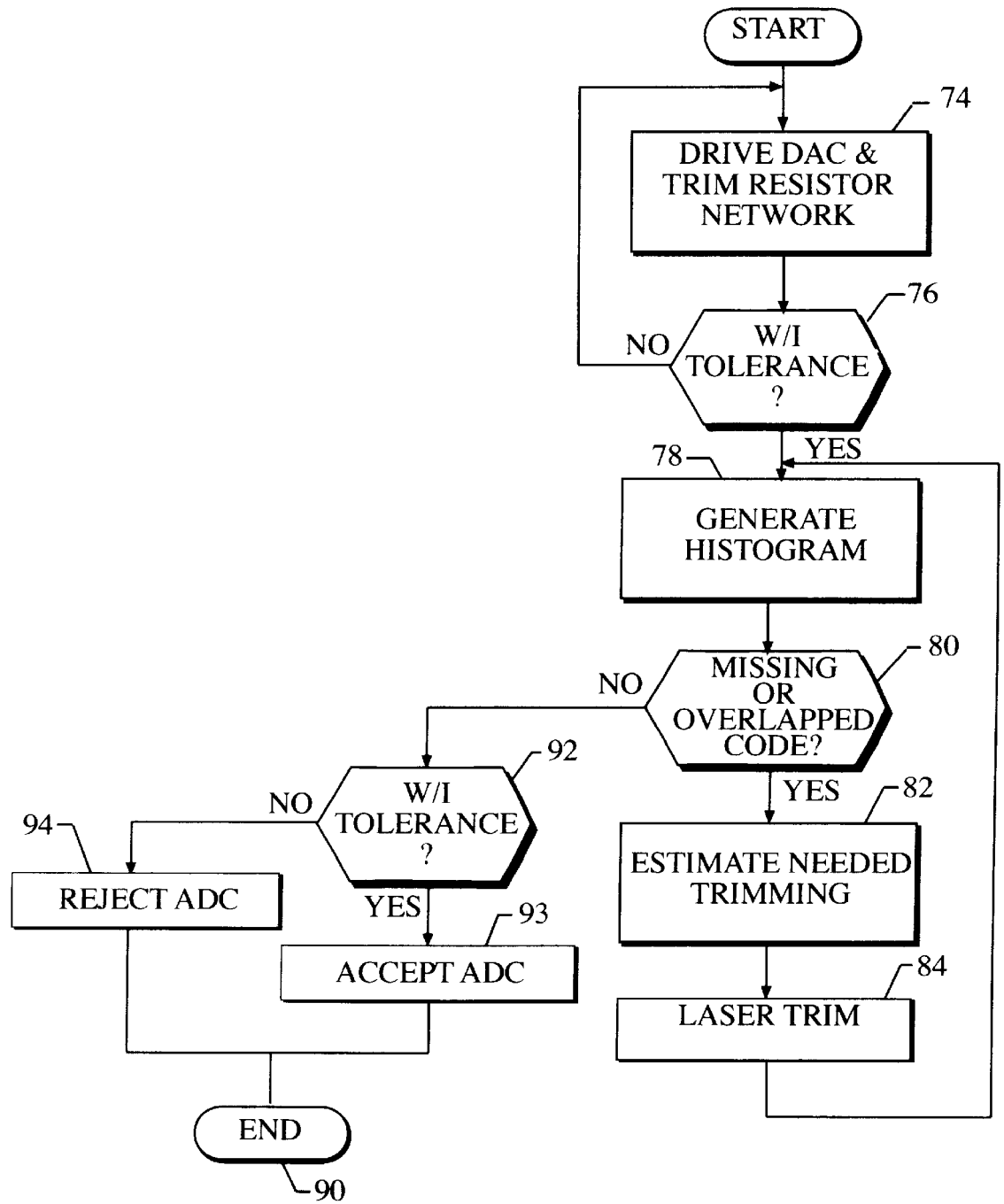
FIG. 4 is a flow chart of a method in accordance with the present invention.

A three subconverter stage multi-step ADC 60 is understood with reference to FIG. 3. In this embodiment the third subconverter stage 61 includes only the flash ADC. Those of skill in the art will readily appreciate operation of this analog-to-digital converter 60 as the other circuit elements are similar to those described above. Those of skill in the art will recognize that the pipelined embodiments of an ADC may be more efficient than the multi-step implementations, since there is typically less idle time for the pipelined configuration.

The method and apparatus aspects of the invention are further understood with additional reference to FIGS. 4 through 12. As shown in the flow chart of FIG. 4, after the start Block 70, the resistor network for the DAC is driven and trimmed at Block 74. The DAC resistors may be isolated and a current forced therethrough to establish a voltage across the resistor ladder. The drive current is preferably a constant fixed value. The tap voltages can be calculated and the resistors trimmed, if necessary, to correct any errors exceeding tolerances. If the DAC is within tolerance at Block 76, the method proceeds to consider and correct for a non-ideal gain of the interstage amplifier.

At Block 78 the ADC is operated to generate an initial histogram as would be readily understood by those skilled in the art. The initial histogram preferably may indicate missing codes as shown, for example, in the histogram of FIG. 5 or may have overlapping codes as in FIG. 10. If the histogram has a missing or overlapping code as determined at Block 80, an estimate is made of the needed trimming (Block 82). A formula to estimate the amount of adjustment that has to be done on the reference voltage is given by:

$$\text{Vr new} = \text{Vr}\left(1 - \frac{D}{2^{n-m}}\right)$$

where
- Vr=reference voltage used in generating the first histogram
- D=number of missing or overlap codes
    - D>0 for missing codes
    - D<0 for overlap codes
- N=ADC resolution in bits, and
- M=first subconverter resolution in bits assuming 1-bit overlap for redundancy.

The trimming is accomplished by laser trimming at Block 84. The histogram is again generated at Block 78. If the laser trimming has provided the needed correction as determined at Block 80 the process is complete (Block 90). If the error has been only partially corrected, for example, the estimating and trimming steps may be repeated as would be readily appreciated by those skilled in the art. If the ADC is otherwise within tolerance at Block 92 it is accepted (Block 93), and if not, it is rejected (Block 94) and the process ends (Block 90).

Figure 5:
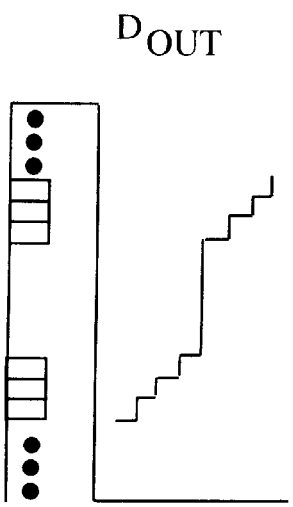
FIG. 5 is a part of a transfer curve and corresponding histogram of an analog-to-digital converter having a missing code and before any trimming of the reference voltage generator in accordance with the present invention.
Figure 6:
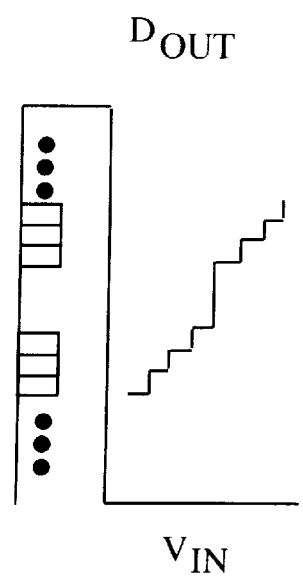
FIG. 6 is a part of a transfer curve and corresponding histogram of an analog-to-digital converter as in FIG. 5 and after a first trimming of the reference voltage generator in accordance with the present invention.
Figure 7:
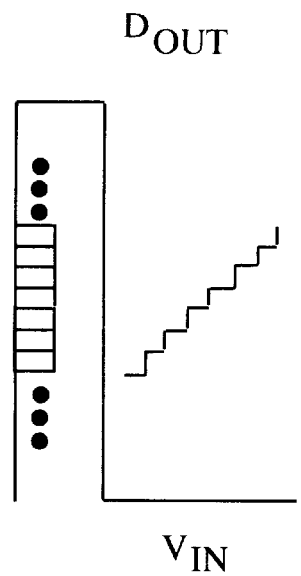
FIG. 7 is a part of a transfer curve and corresponding histogram of an analog-to-digital converter as in FIG. 6 and after a final trimming of the reference voltage generator in accordance with the present invention.
Figure 10:
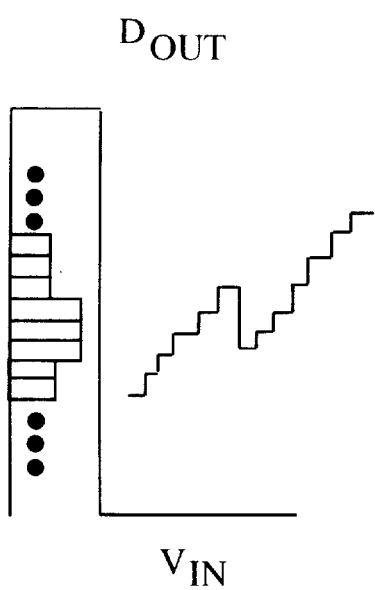
FIG. 10 is a part of a transfer curve and corresponding histogram of an analog-to-digital converter having an overlapping code and before any trimming of the reference voltage generator in accordance with the present invention.
Figure 11:
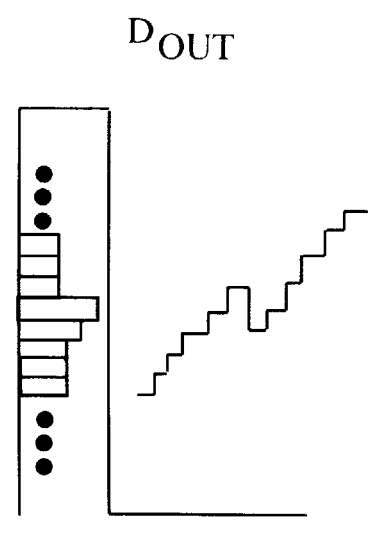
FIG. 11 is a part of a transfer curve and corresponding histogram of an analog-to-digital converter as in FIG. 10 and after a first trimming of the reference voltage generator in accordance with the present invention.

Turning briefly to FIGS. 5, 6 and 7 the progression of a two step adjustment for missing codes is understood. FIG. 5 illustrates a relatively wide gap indicating several missing codes; FIG. 6 illustrates a partial adjustment where the number of missing codes is reduced; and FIG. 7 illustrates the fully adjusted or corrected ADC output. Similarly, FIG. 10 illustrates the case of several overlapping codes prior to any correction, and FIG. 11 illustrates a partial correction for overlapping codes. The full correction of overlapping codes produces an output as in FIG. 7 as would be readily understood by those skilled in the art.

Figure 8:
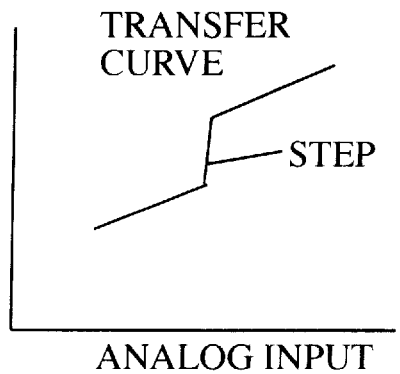
FIG. 8 is a graph of the transfer curve of the analog-to-digital converter during a calibration in accordance with the present invention.
Figure 9:
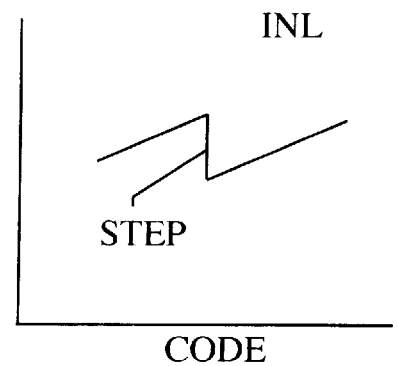
FIG. 9 is a graph of the INL curve of the analog-to-digital converter during a calibration in accordance with the present invention.

Referring now briefly to FIG. 8, the illustrated transfer curve has an abrupt step or jump, the size of which is indicative of the number of missing codes. The corresponding INL curve of FIG. 9 also shows the step and wherein the step size also corresponds to the number of missing codes.

Figure 12:
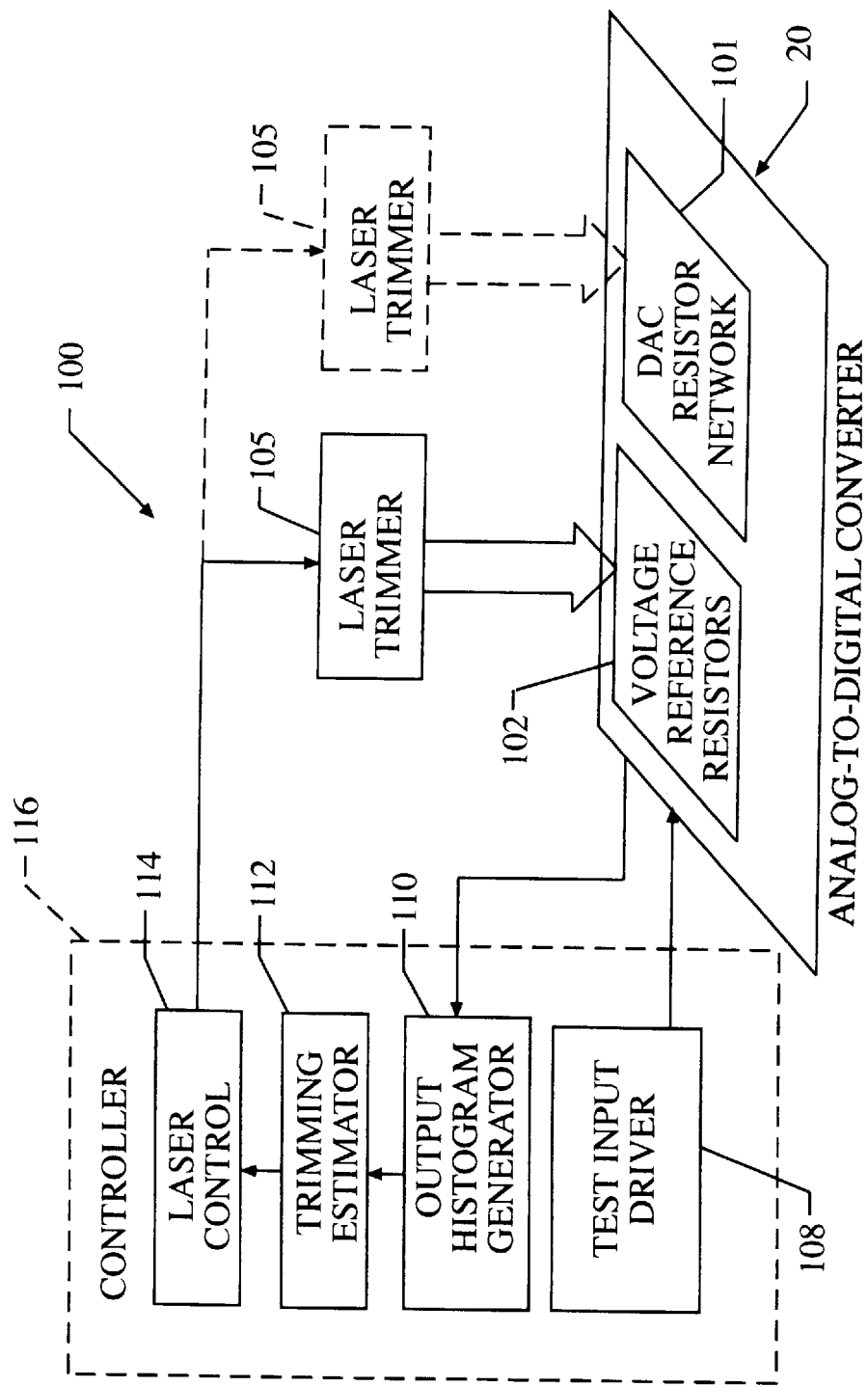
FIG. 12 is schematic diagram of an apparatus for trimming an analog-to-digital converter in accordance with the present invention.

The apparatus 100 according to another aspect of the present invention is explained with particular reference to the schematic diagram of FIG. 12. The apparatus 100 includes a conventional laser trimmer 105 that may be used to trim thin film resistors for one or both of the schematically illustrated DAC resistor network 101 and the voltage reference resistors 102 of the ADC 20. The laser trimmer 105 is operated by the schematically illustrated controller 116.

In particular, the controller 116 illustratively includes a test input driver circuit 108 that may provide the desired input for generating the output histogram for correcting for a non-ideal interstage amplifier gain as discussed in greater detail above. These input signals may take the form of sinusoidal or other signals with a known amplitude probability distribution function as would be readily understood by those skilled in the art. The test input driver circuit 108 may also supply the current for calibration of the DAC resistor network 101 as also described above.

The controller 116 also includes an output histogram generator circuit 110 for generating histogram data for the ADC 20 being calibrated. The output histogram generator 110 cooperates with the trimming estimator 112 which estimates an amount of voltage reference resistor trimming to correct for the non-ideal gain of the interstage amplifier as described above. The trimming estimator 112, in turn, cooperates with the laser control circuit 114 to drive the laser trimmer 105. Those of skill in the art will readily appreciate that the apparatus 100 could also adjust the desired reference voltages by disconnecting fuse links and other methods, for example as also discussed herein. The histogram generation may be performed continuously during the adjusting process, or may be performed after each adjustment or trimming as would be readily understood by those skilled in the art.

A low power, wide input bandwidth, low distortion ADC is provided by the present invention. In addition, the invention also provides a method and apparatus for making the ADC. Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A analog-to-digital converter (ADC) integrated circuit comprising:

sampling means for sampling an analog input signal;

a plurality of subconverter stages comprising a first subconverter stage being connected to said sampling means and a second subconverter stage connected to said first subconverter stage, said first subconverter stage comprising an amplifier for driving the second subconverter stage, said amplifier having a non-ideal gain;

reference voltage means for generating reference voltages for each of said subconverter stages, said reference voltage means comprising adjusted reference voltage output means for providing an adjusted reference voltage to the second subconverter stage to compensate for the non-ideal gain of said amplifier; and output means connected to said subconverter stages for generating a digital output signal.

2. An analog-to-digital converter (ADC) according to claim 1 wherein said reference voltage output means comprises original reference voltage output means for providing an original reference voltage for the first subconverter stage.

3. An analog-to-digital converter (ADC) according to claim 1 wherein said adjusted reference voltage output means comprises at least one trimmed thin film resistor.

4. An analog-to-digital converter (ADC) according to claim 1 wherein said amplifier comprises a switched capacitor amplifier.

5. An analog-to-digital converter (ADC) according to claim 1 wherein said amplifier has a non-ideal gain resulting in at least one missing code in the digital output signal before adjusting of said adjusted reference voltage output means to compensate for the missing code.

6. An analog-to-digital converter (ADC) according to claim 1 wherein said amplifier has a non-ideal gain resulting in at least one overlapping code in the digital output signal before adjusting of said adjusted reference voltage output means to compensate for the overlapping code.

7. An analog-to-digital converter (ADC) according to claim 1 wherein said output means comprises digital error correction means for correcting the output signal.

8. An analog-to-digital converter (ADC) according to claim 1 further comprising timing control means for supplying clock signals to said sampling means and said subconverter stages.

9. An analog-to-digital converter (ADC) according to claim 1 wherein each of said subconverter stages comprises:

a flash analog-to-digital converter; and a digital-to-analog converter connected to said flash analog-to-digital converter.

10. An analog-to-digital converter (ADC) according to claim 9 wherein the digital-to-analog converter of the first subconverter stage comprises a trimmed thin film resistor network to compensate for an error in the digital-to-analog converter.

11. An analog-to-digital converter (ADC) according to claim 1 wherein said sampling means comprises open loop sampling means for operating at a relatively wide bandwidth.

12. An analog-to-digital converter (ADC) according to claim 1 wherein said reference voltage output means comprises second adjusted reference voltage output means for providing an adjusted reference voltage to at least one subconverter stage downstream from said second subconverter stage to compensate for a non-ideal gain of the associated amplifier.

13. An analog-to-digital converter (ADC) according to claim 1 wherein said reference voltage output means comprises second original reference voltage output means for providing an adjusted reference voltage to each subconverter stage downstream from said second subconverter stage.

14. A analog-to-digital converter (ADC) integrated circuit comprising:

sampling means for sampling an analog input signal;

a first subconverter stage being connected to said sampling means and a second subconverter stage connected to said first subconverter stage, said first subconverter stage comprising a switched capacitor amplifier for driving the second subconverter stage, said switched capacitor amplifier having a non-ideal gain;

reference voltage means for generating respective reference voltages for said first and second subconverter stages, said reference voltage means comprising original reference voltage output means for providing an original reference voltage to the first subconverter stage, and adjusted reference voltage output means for providing an adjusted reference voltage to the second subconverter stage to compensate for the non-ideal gain of said switched capacitor amplifier so that capacitor trimming for said amplifier is not needed; and output means connected to said subconverter stages for generating a digital output signal.

15. An analog-to-digital converter (ADC) according to claim 14 wherein said adjusted reference voltage output means comprises at least one trimmed thin film resistor.

16. An analog-to-digital converter (ADC) according to claim 14 wherein said amplifier has a non-ideal gain resulting in at least one missing code in the digital output signal before adjustment of said adjusted reference voltage output means to compensate for the missing code.

17. An analog-to-digital converter (ADC) according to claim 14 wherein said amplifier has a non-ideal gain resulting in at least one overlapping code in the digital output signal before adjustment of said adjusted reference voltage output means to compensate for the overlapping code.

18. An analog-to-digital converter (ADC) according to claim 14 wherein said output means comprises digital error correction means for correcting the output signal.

19. An analog-to-digital converter (ADC) according to claim 14 wherein each of said subconverter stages comprises:

a flash analog-to-digital converter; and a digital-to-analog converter connected to said flash analog-to-digital converter.

20. An analog-to-digital converter (ADC) according to claim 19 wherein the digital-to-analog converter of the first subconverter stage comprises a trimmed thin film resistor network to compensate for an error in the digital-to-analog converter.

21. An analog-to-digital converter (ADC) according to claim 14 wherein said reference voltage output means comprises second adjusted reference voltage output means for providing an adjusted reference voltage to at least one subconverter stage downstream from said second subconverter stage to compensate for a non-ideal gain of the associated amplifier.

22. An analog-to-digital converter (ADC) according to claim 14 wherein said reference voltage output means comprises second original reference voltage output means for providing an adjusted reference voltage to each subconverter stage downstream from said second subconverter stage.

23. A analog-to-digital converter (ADC) integrated circuit comprising:
sampling means for sampling an analog input signal;
a subconverter stage and timing control means associated therewith for successively operating said subconverter stage a plurality of times, said subconverter stage comprising an amplifier for driving a subsequent operation of said subconverter stage, said amplifier having a non-ideal gain;
reference voltage means for generating reference voltages for each operation of said subconverter stage, said reference voltage means comprising adjusted reference voltage output means for providing an adjusted reference voltage for a second operation of said subconverter stage to compensate for the non-ideal gain of said amplifier; and
output means connected to said subconverter stage for generating a digital output signal.

24. An analog-to-digital converter (ADC) according to claim 23 wherein said reference voltage output means comprises original reference voltage output means for providing an original reference voltage for a first operation of said subconverter stage.

25. An analog-to-digital converter (ADC) according to claim 23 wherein said adjusted reference voltage output means comprises at least one trimmed thin film resistor.

26. An analog-to-digital converter (ADC) according to claim 23 wherein said amplifier comprises a switched capacitor amplifier.

27. An analog-to-digital converter (ADC) according to claim 23 wherein said amplifier has a non-ideal gain resulting in at least one missing code in the digital output signal before trimming of said trimmed reference voltage output means to compensate for the missing code.

28. An analog-to-digital converter (ADC) according to claim 23 wherein said amplifier has a non-ideal gain resulting in at least one overlapping code in the digital output signal before trimming of said trimmed reference voltage output means to compensate for the overlapping code.

29. An analog-to-digital converter (ADC) according to claim 23 wherein said output means comprises digital error correction means for correcting the output signal.

30. An analog-to-digital converter (ADC) according to claim 23 wherein said subconverter stage comprises a digital-to-analog converter; and wherein said digital-to-analog converter comprises a trimmed thin film resistor network to compensate for an error in the digital-to-analog converter.

31. An analog-to-digital converter (ADC) according to claim 23 wherein said sampling means comprises open loop sampling means for operating at a relatively wide bandwidth.

32. An analog-to-digital converter (ADC) according to claim 23 wherein said reference voltage output means further comprises second adjusted reference voltage means for providing an adjusted reference voltage for at least one operation of said subconverter stage after the second operation of the subconverter stage.

33. An analog-to-digital converter (ADC) according to claim 23 wherein said reference voltage output means comprises second original reference voltage output means for providing an original reference voltage for all subsequent operation of said subconverter stage after the second operation.

34. A analog-to-digital converter (ADC) integrated circuit comprising:
sampling means for sampling an analog input signal;
a subconverter stage and timing control means for successively operating said subconverter stage a plurality of times, said subconverter stage comprising a switched capacitor amplifier for driving a subsequent operation of said subconverter stage, said switched capacitor amplifier having a non-ideal gain;
reference voltage means for generating reference voltages for each operation of said subconverter stage, said reference voltage means comprising
original reference voltage output means for providing an original reference voltage to a first operation of the subconverter stage, and
adjusted reference voltage output means for providing an adjusted reference voltage for a second operation of the subconverter stage to compensate for the non-ideal gain of said switched capacitor amplifier so that capacitor trimming for said amplifier is not needed; and
output means connected to said subconverter stages for generating a digital output signal.

35. An analog-to-digital converter (ADC) according to claim 34 wherein said adjusted reference voltage output means comprises at least one trimmed thin film resistor.

36. An analog-to-digital converter (ADC) according to claim 34 wherein said switched capacitor amplifier has a non-ideal gain resulting in at least one missing code in the digital output signal before adjustment of said adjusted reference voltage output means to compensate for the missing code.

37. An analog-to-digital converter (ADC) according to claim 34 wherein said switched capacitor amplifier has a non-ideal gain resulting in at least one overlapping code in the digital output signal before adjustment of said adjusted reference voltage output means to compensate for the overlapping code.

38. An analog-to-digital converter (ADC) according to claim 34 wherein said subconverter stage comprises a digital-to-analog converter; and wherein said digital-to-analog converter comprises a trimmed thin film resistor network to compensate for an error in the digital-to-analog converter.

39. An analog-to-digital converter (ADC) according to claim 34 wherein said reference voltage output means further comprises second adjusted reference voltage means for providing an adjusted reference voltage for at least one operation of said subconverter stage after the second operation of the subconverter stage.

40. An analog-to-digital converter (ADC) according to claim 34 wherein said reference voltage output means comprises second original reference voltage output means for providing an original reference voltage for all subsequent operation of said subconverter stage after the second operation.

41. A method for enhancing the accuracy of an analog-to-digital converter (ADC) integrated circuit of a type comprising a first subconverter stage and a second subconverter stage connected thereto, the first subconverter stage comprising an amplifier for driving the second subconverter stage, the amplifier having a non-ideal gain; and reference voltage means for generating reference voltages for the subconverter stages, the reference voltage means comprising adjustable reference voltage output means for providing a adjusted reference voltage to the second subconverter stage, said method comprising the steps of:

generating a first output histogram for the ADC; and adjusting the adjustable reference voltage output means, based upon the first output histogram, to provide an adjusted reference voltage to the second subconverter stage to compensate for the non-ideal gain of the amplifier and thereby provide enhanced accuracy for the ADC integrated circuit.

42. A method according to claim 41 further comprising the step of estimating an amount of adjustment based upon the first output histogram prior to the adjusting step.

43. A method according to claim 41 further comprising the steps of:

generating a second output histogram after the adjusting; and adjusting the adjustable reference voltage output means, based upon the second histogram, to further compensate for the non-ideal gain of the amplifier.

44. A method according to claim 41 wherein the adjustable reference voltage means comprises at least one thin film resistor; and wherein the step of adjusting comprises laser trimming the thin film resistor.

45. A method according to claim 41 further comprising the step of providing an original reference voltage for the first subconverter stage.

46. A method according to claim 41 wherein the amplifier has a non-ideal gain resulting in at least one missing code in the digital output signal before adjusting of the adjustable reference voltage output means to compensate for the missing code.

47. A method according to claim 41 wherein the amplifier has a non-ideal gain resulting in at least one overlapping code in the digital output signal before adjusting of the adjustable reference voltage output means to compensate for the overlapping code.

48. A method according to claim 41 wherein each of the subconverter stages comprises a digital-to-analog converter including a trimmable resistor network; and further comprising the step of trimming the resistor network to compensate for an error in the digital-to-analog converter.

49. A method for enhancing the accuracy of an analog-to-digital converter (ADC) integrated circuit of a type comprising a subconverter stage and timing control means for successively operating the subconverter stage a plurality of times, the subconverter stage comprising an amplifier having a non-ideal gain; and reference voltage means for generating reference voltages for successive operations of the subconverter stage, the reference voltage means comprising adjustable reference voltage output means for providing an adjusted reference voltage for a second operation of subconverter stage, said method comprising the steps of:

generating a first output histogram for the ADC; and adjusting the adjustable reference voltage output means, based upon the first output histogram, to provide an adjusted reference voltage for the second operation of the subconverter stage to compensate for the non-ideal gain of the amplifier and thereby provide enhanced accuracy for the ADC integrated circuit.

50. A method according to claim 49 further comprising the step of estimating an amount of adjusting based upon the first output histogram prior to the adjusting step.

51. A method according to claim 49 further comprising the steps of:

generating a second output histogram after the adjusting; and adjusting the adjustable reference voltage output means, based upon the second histogram, to further compensate for the non-ideal gain of the amplifier.

52. A method according to claim 49 wherein the adjustable reference voltage means comprises at least one thin film resistor; and wherein the step of adjusting comprises laser trimming the thin film resistor.

53. A method according to claim 49 further comprising the step of providing an original reference voltage for the first operation of the subconverter stage.

54. A method according to claim 49 wherein the amplifier has a non-ideal gain resulting in at least one missing code in the digital output signal before adjusting of the adjustable reference voltage output means to compensate for the missing code.

55. A method according to claim 49 wherein the amplifier has a non-ideal gain resulting in at least one overlapping code in the digital output signal before adjusting of the adjustable reference voltage output means to compensate for the overlapping code.

56. A method according to claim 49 wherein the subconverter stage comprises a digital-to-analog converter including a trimmable resistor network; and further comprising the step of trimming the resistor network to compensate for an error in the digital-to-analog converter.

57. An apparatus for enhancing the accuracy of an analog-to-digital converter (ADC) integrated circuit of a type comprising a first subconverter stage and a second subconverter stage connected thereto, the first subconverter stage comprising an amplifier for driving the second subconverter stage, the amplifier having a non-ideal gain; and reference voltage means for generating reference voltages for the subconverter stages, the reference voltage means comprising adjustable reference voltage output means for providing an adjusted reference voltage to the second subconverter stage, said apparatus comprising:

first histogram means for generating a first output histogram for the ADC; and first adjusting means for adjusting the adjustable reference voltage output means, based upon the first output histogram, to provide an adjusted reference voltage to the second subconverter stage to compensate for the non-ideal gain of the amplifier and thereby provide enhanced accuracy for the ADC integrated circuit.

58. An apparatus according to claim 57 further comprising estimating means for estimating an amount of adjusting based upon the first output histogram prior to the adjusting step.

59. An apparatus according to claim 57 further comprising:

second histogram means for generating a second output histogram after the adjusting; and second adjusting means for further adjusting the adjustable reference voltage output means, based upon the second histogram, to further compensate for the non-ideal gain of the amplifier.

60. An apparatus according to claim 57 wherein the adjustable reference voltage means comprises at least one thin film resistor; and wherein said first adjusting means comprises laser trimming means for trimming the thin film resistor.

61. An apparatus according to claim 57 wherein said first histogram means comprises test input means for generating a first test input to said ADC.

62. An apparatus according to claim 57 wherein each of the subconverter stages comprises a digital-to-analog converter including a trimmable resistor network; and further comprising DAC trimmer means for trimming the resistor network to compensate for an error in the digital-to-analog converter of the first subconverter stage.

63. An apparatus for enhancing the accuracy of an analog-to-digital converter (ADC) integrated circuit of a type comprising a subconverter stage and timing control means for successively operating the subconverter stage a plurality of times, the subconverter stage comprising an amplifier having a non-ideal gain; and reference voltage means for generating reference voltages for successive operations of the subconverter stage, the reference voltage means comprising adjustable reference voltage output means for providing an adjusted reference voltage for a second operation of subconverter stage, said apparatus comprising:

first histogram means for generating a first output histogram for the ADC; and first adjusting means for adjusting the adjustable reference voltage output means, based upon the first output histogram, to provide an adjusted reference voltage for the second operation of the subconverter stage to compensate for the non-ideal gain of the amplifier and thereby provide enhanced accuracy for the ADC integrated circuit.

64. An apparatus according to claim 63 further comprising estimating means for estimating an amount of adjusting based upon the first output histogram prior to the adjusting step.

65. An apparatus according to claim 63 further comprising:

second histogram means for generating a second output histogram after the adjusting; and second trimming means for further adjusting the adjustable reference voltage output means, based upon the second histogram, to further compensate for the non-ideal gain of the amplifier.

66. An apparatus according to claim 63 wherein the adjustable reference voltage means comprises at least one thin film resistor; and wherein said first adjusting means comprises laser trimming means for trimming the thin film resistor.

67. An apparatus according to claim 63 wherein said first histogram means comprises test input means for generating a first test input to said ADC.

68. An apparatus according to claim 63 wherein the subconverter stage comprises a digital-to-analog converter including a trimmable resistor network; and further comprising DAC trimmer means for trimming the resistor network to compensate for an error in the digital-to-analog converter.

\* \* \* \* \*